United States Patent [19]

Tjebben

[11] Patent Number: 4,961,051
[45] Date of Patent: Oct. 2, 1990

[54] NON-ACTUATING RELAY DRIVER TESTER
[75] Inventor: Michael O. Tjebben, Raleigh, N.C.
[73] Assignee: Alcatel NA, Inc., Hickory, N.C.
[21] Appl. No.: 437,075
[22] Filed: Nov. 14, 1989

Related U.S. Application Data

[63] Continuation-in-part of Ser. No. 286,474, Dec. 19, 1988, abandoned.

[51] Int. Cl.$^5$ .................... G01R 31/00; H01H 47/00
[52] U.S. Cl. .................................. 324/415; 324/418; 361/186; 361/187
[58] Field of Search ............... 324/415, 418, 422, 500, 324/546, 537; 340/644, 511; 307/270; 361/153, 186, 187, 160; 371/24, 25, 71

[56] References Cited

U.S. PATENT DOCUMENTS

| | | | |
|---|---|---|---|
| 3,548,301 | 12/1970 | Zutkis | 340/511 |
| 3,599,179 | 8/1971 | Arnold | 364/200 |
| 3,633,016 | 1/1977 | Walker et al. | 371/24 |
| 3,924,178 | 12/1975 | Lockyer et al. | 324/418 |
| 4,696,785 | 9/1987 | Cook et al. | 324/415 X |
| 4,701,635 | 10/1987 | Kawazoe et al. | 307/270 |
| 4,764,884 | 8/1988 | Noyori | 324/422 X |

Primary Examiner—Reinhard J. Eisenzopf
Assistant Examiner—Jack B. Harvey
Attorney, Agent, or Firm—Peter C. Van der Sluys

[57] ABSTRACT

By providing control logic for initiating a predetermined test sequence depending upon the known state of a relay, a unique testing circuit is attained whereby the relay drivers connected to the opposed sides of the relay coil are fully evaluated without causing the relay to be activated. In the preferred embodiment, the relay comprises a latching-type relay and the relay drivers comprise separate high-power CMOS devices. In this configuration, the control logic separately activates each transistor of each of the high-power CMOS devices without causing the relay to be switched between its two alternate configurations. Furthermore, the control logic originally sets the latching-type relay into one of its two configurations and then shuts off the power until activated for initiating the test sequence. In addition, the control logic is employed to check each transistor during the test sequence and assure its operation.

12 Claims, 1 Drawing Sheet

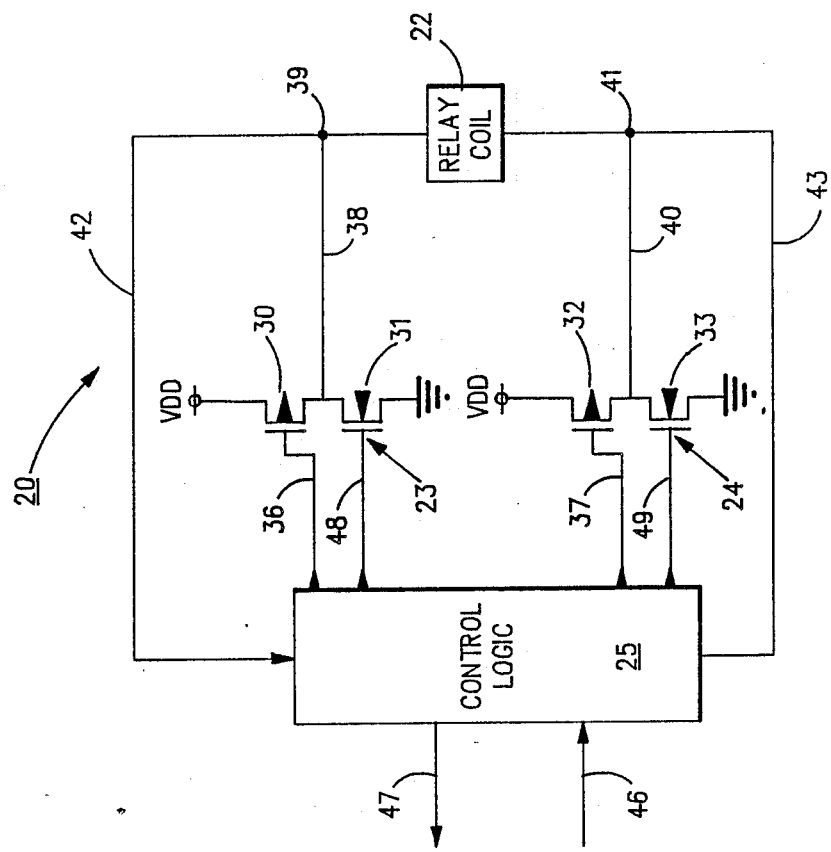

NON-ACTUATING RELAY DRIVER TESTER

CROSS-REFERENCE TO RELATED APPLICATIONS

This application is a continuation-in-part of U.S. application Ser. No. 286,474 filed Dec. 19, 1988, now abandoned.

BACKGROUND OF THE INVENTION

1. Field of the Invention

This invention relates to circuitry for testing the operation of relay drivers and, more particularly, testing circuitry capable of complete operation without causing the relay to be actuated.

2. Description of the Prior Art

Many systems have been developed in order to assure the operation of the relay driver circuitry. However, most of these test circuits require the transmission of a test current through the coil of the relay in order to assure that the relay driver is operating properly. Although such systems are designed to transmit a small test current with the expectation that the relay will not be actuated, it is often found that the relay threshold may be exceeded and unwanted relay actuation may occur. In addition, this testing system requires additional circuitry in order to provide the particularly desired control and testing sequence.

In an attempt to eliminate some of the inherent difficulties encountered with the low current level test method, other test systems have employed the transmission of short duration pulses to the relay in order to test the relay driver circuitry. By employing pulses of short duration, the relay typically will not respond to the voltage and will not be switched. However, this system depends on the precise pulse duration and, in addition, requires added circuitry in order to attain the desired results.

Therefore, it is the principal object of the present invention to provide a relay driver testing system which requires no additional circuitry and assures that the relay coil is not actuated.

Another object of the present invention is to provide a relay driver testing system having the characteristic features described above which assures dependable operation and complete testing of all components of the relay driver.

Other and more specific objects will in part be obvious and will in part appear hereinafter.

SUMMARY OF THE INVENTION

The present invention overcomes the prior art difficulties and drawbacks by providing control means which determines the particular condition of the relay and provides an appropriate test sequence whereby every component of the relay driver is independently activated in order to assure its operation, while the relay is never activated. By employing the unique control means, the relay driver circuitry can be tested regardless of the configuration of the relay.

Furthermore, in order to assure that each component of the relay driver is fully tested and is operational, the control means also performs a comparison test on the results attained during each step of the test sequence. If any errors are found, the errors are noted, so that appropriate corrections can be made.

In the preferred embodiment of the present invention, the relay comprises a latching-type relay and each side of the relay's coil is driven independently by a high-power CMOS device. In addition, the output of each of the high-power CMOS devices can be driven to provide either a high impedance, the supply voltage, or ground. However, the present invention is equally applicable to any type of latching relay, as well as any type of relay driver.

Prior to initiating the test sequence, the relay is latched in one of its two alternate configurations, with the configuration being remembered by the control means. Upon receipt of a test initiation signal, the control means begins the particular test sequence designed specifically for the configuration in which the relay is latched.

In the test sequence, the control means activates each of the transistors forming the CMOS devices, thereby assuring that the CMOS devices are fully operational. In addition, the test sequence employed by the control means checks the CMOS devices in a manner which assures that the relay coil remains latched in its original state. Furthermore, the control means comprises monitoring to confirm that the output of each of the relay drivers matches the expected output for that particular portion of the test sequence.

The invention accordingly comprises the features of construction, combination of elements, and arrangement of parts which will be exemplified in the construction hereinafter set forth, and the scope of the invention will be indicated in the claims.

DESCRIPTION OF THE DRAWING

For a fuller understanding of the nature and objects of the invention, reference should be had to the following detailed description taken in connection with the accompanying drawing, in which:

The FIGURE represents a schematic of the relay driver test circuit of the present invention.

DETAILED DESCRIPTION OF THE PREFERRED EMBODIMENT

In the FIGURE, the entire relay driver test circuit 20 of the present invention is shown. As detailed therein, circuit 20 incorporates a single, latching-type relay coil 22, relay drivers 23 and 24, and control logic means 25. As detailed above, relay 22 comprises a single coil, latching-type relay. In addition, relay driver 23 comprises a high-power CMOS device incorporating transistors 30 and 31. Similarly, relay driver 24 comprises a high-power CMOS device comprising transistors 32 and 33. Both CMOS devices 23 and 24 are constructed so as to provide an output comprising either a high impedance, the supply voltage, or ground.

Control logic means 25 is constructed to provide a particular preset test sequence depending upon the particular state in which relay coil 22 is latched. In the test sequences of this invention, the voltage across relay coil 22 is maintained at either zero or at the same polarity of the voltage originally employed to switch the relay into its particular configuration. In this way, relay coil 22 will remain latched in its original configuration.

Furthermore, the test sequences provided by control logic means 25 independently activate each transistor 30, 31, 32 and 33 in a pre-selected sequence, so that each of the transistors is tested, while assuring that the voltage across relay coil 22 remains unchanged.

Control logic means 25 also preferably incorporates monitoring means to confirm that each transistor is switched in the manner anticipated, and that any switching failure is noted. In this way, the complete operation of relay drivers 23 and 24 is assured, while relay coil 22 remains unactivated throughout the entire testing sequence.

As shown in the FIGURE, control logic means 25 is connected to CMOS device 23 by lines 36 and 48, and is connected to CMOS device 24 by lines 37 and 49. In addition, the output from CMOS device 23 is transmitted along line 38 through junction 39 to one side of relay coil 22. Similarly, the output of CMOS device 24 is transmitted along line 40 through junction 41 to the other side or relay coil 22.

In order to assure that transistors 30 and 31 of CMOS device 23 are operational, control logic means 25 monitors the output of CMOS device 23 along line 42 which is connected to junction 39. Similarly, control logic means 25 monitors the output of CMOS device 24 along line 43 which is connected between control logic means 25 and junction 41.

Circuit 20 is completed by input line 46 to control logic means 25 which sends an enable signal to control logic means 25 to initiate the test sequence. In addition, output line 47 from control logic means 25 provides a transistor status signal, which is activated whenever a transistor fails to operate properly during the test sequence.

Prior to initiating the testing of CMOS devices 23 and 24, relay coil 22 would be latched in one of its two alternate configurations. In order for control logic means 25 to initiate the proper test sequence, control logic means 25 latches relay coil 22 in one of its two configurations and records the configuration in which the coil has been latched.

In order to latch relay coil 22 in its first configuration, control logic means 25 outputs a zero or ground to both lines 36 and 48, while outputting a one or a positive voltage on both lines 37 and 49. As is more fully detailed below, a zero output on both lines 36 and 48 causes CMOS device 23 to output a one or positive voltage on line 38 to relay coil 22 through junction 39. Simultaneously therewith, CMOS device 24 outputs a zero, or ground, on line 40 to the opposed end of relay coil 22 through junction 41. By having a one at junction 39 and a zero at junction 41, relay coil 22 is activated and latched in one of its two alternate configurations.

Alternatively, if junction 41 has a positive voltage relative to junction 39, relay coil 22 will be latched in the second of its two alternate configurations. The second configuration is attained when control logic means 25 outputs a one on both lines 36 and 48 while outputting a zero on both lines 37 and 49. In this instance, CMOS device 23 outputs a zero on line 38 to relay coil 22 through junction 39, while CMOS device 24 outputs a one to the opposed side of the relay coil 22 through junction 41. In this way, relay coil 22 would be latched in the second of its two alternate configurations.

Once control logic means 25 has been activated to latch relay coil 22 in either of its two configurations, control logic means 25 automatically causes a one to be outputted to both lines 36 and 37 and a zero to be outputted to both lines 48 and 49. In this way, both CMOS devices 23 and 24 will be turned off (put in high impedance states) in order to conserve power. However, since relay coil 22 is latched in one of its configurations, the presence of high impedance at both junctions 39 and 41 will not affect relay coil 22.

When activated to test the relay drivers, by receipt of a signal on line 46, control logic means 25 automatically initiates the proper test sequence, depending upon the configuration in which relay coil 22 has been latched. If relay coil 22 is latched in its first configuration, by the presence of a positive voltage at junction 39 relative to junction 41, control logic means 25 will initiate its test sequence by outputting zeroes to lines 37 and 49, while continuing to output a one to line 36 and a zero to line 48.

The presence of zeroes on lines 37 and 49 to CMOS device 24 causes transistor 32 to turn on and transmit a one on line 40 to relay coil 22 through junction 41, while transistor 33 is turned off. However, since a high impedance is still present at junction 39, the presence of a one at junction 41 assures that relay coil 22 remains in its present latched configuration.

At this time, control logic means 25 compares the signal on line 43 from junction 41 to the signal on line 37. If the signals are opposite to each other, CMOS device 24 passes this part of the test and the ability that transistor 32 can turn on and that transistor 33 can turn off is confirmed.

Similarly, control logic means 25 tests the signal at junction 39 through line 42 and compares the signal to the signal on line 37. If these signals are opposite or inverse to each other, CMOS device 23 passes this part of the test.

If the signal at junction 39 is found to be equivalent to the signal at line 37 or the signal at junction 41 is equivalent to the signal on line 37, CMOS devices 23 and 24 fail this part of the test, and the failure is noted by an output signal on line 47.

In the second step of the test sequence, control logic means 25 outputs ones to lines 37 and 49 while continuing to output a zero to line 48 and a one to line 36. The presence of ones on lines 37 and 49 causes CMOS device 24 to output a zero on line 40 to relay coil 22 through junction 41, by transistor 32 turning off and transistor 33 turning on. However, since relay coil 22 has a high impedance at its opposed end, through junction 39, there is no voltage difference across the relay coil and no relay switching takes place.

In order to verify the proper operation of the relay drivers, control logic means 25 monitors and compares the signal on line 43 to the signal on line 37, while comparing the signal on line 42 to the signal on line 37. If the signals being compared are opposite, control logic means 24 knows that CMOS devices 23 and 24 have passed this phase of the test. In doing so, control logic means 25 verifies that transistor 32 can turn off and transistor 33 can turn on.

In the third step of this test procedure, control logic means 25 outputs a one to line 37 and a zero to line 49 causing CMOS device 24 to provide a high impedance to junction 41 through line 40. Control logic means 25 outputs zeroes to lines 36 and 48 causing transistor 30 to turn on and transistor 31 to turn off, thereby causing CMOS device 23 to output a one to junction 39 through line 38. However, since a high impedance is still present at junction 41, the presence of a one at junction 39 does not cause the relay to activate since the voltage across the relay coil is zero.

At this time, control logic means 25 compares the signal on line 42 to the signal on line 36. If the signals are opposite to each other, CMOS device 23 passes this part of the test, and the ability that transistor 30 can turn on and transistor 31 can turn off is confirmed.

Similarly, control logic means 25 tests the signal at junction 41 through line 43 and compares the signal to the signal on line 36. If these signals are opposite or inverse to each other, CMOS device 24 passes this part of the test.

If the signal at junction 39 is found to be equivalent to the signal at line 36 or the signal at junction 41 is equivalent to the signal on line 36, CMOS devices 23 and 24 fail this part of the test, and the failure is noted by an output signal on line 47.

In the fourth step of this test procedure, control logic means 25 outputs ones to lines 36 and 48 causing transistor 30 to turn off and transistor 31 to turn on, thereby causing CMOS device 23 to output a zero to junction 39 through line 38. At the same time, control logic means 25 outputs a one to line 37 and a zero to line 49 to cause CMOS device 24 to provide a high impedance to junction 41 through line 40. Since a high impedance is present at junction 41, the presence of a zero at junction 39 does not cause the relay to activate, since the voltage across the relay coil is zero.

At this time, control logic means 25 compares the signal on line 42 to the signal on line 36. If the signals are opposite to each other, CMOS device 23 passes this part of the test, and the ability that transistor 30 can turn off and transistor 31 can turn on is confirmed.

Similarly, control logic means 25 tests the signal at junction 41 through line 43 and compares the signal to the signal on line 36. If these signals are opposite or inverse to each other, CMOS device 24 passes this part of the test.

If the signal at junction 39 is found to be equivalent to the signal at line 36 or the signal at junction 41 is equivalent to the signal on line 36, CMOS devices 23 and 24 fail this part of the test, and the failure is noted by an output signal on line 47.

The final step in the testing sequence is for control logic means 25 to output ones to both lines 36 and 37 and zeroes to both lines 48 and 49, thus returning the entire circuit to its original state with the relay drivers turned off. At this point, control logic means 25 has verified the correct operation of all transistors.

By referring to Table 1, the test sequence employed for the first configuration is fully detailed, with the status of the lines and the results achieved being provided.

TABLE 1

| | Line 36 | Line 48 | Line 37 | Line 49 | Junct. 39 | Junct. 41 | Test Result |
|---|---|---|---|---|---|---|---|
| Config. 1 (set) | 0 | 0 | 1 | 1 | 1 | 0 | |
| Config. 1 (off) | 1 | 0 | 1 | 0 | High Imped. | High Imped. | |
| Test Sequence | | | | | | | |
| Step 1 | 1 | 0 | 0 | 0 | 1 | 1 | 32 on/33 off |
| Step 2 | 1 | 0 | 1 | 1 | 0 | 0 | 32 off/33 on |
| Step 3 | 0 | 0 | 1 | 0 | 1 | 1 | 30 on/31 off |
| Step 4 | 1 | 1 | 1 | 0 | 0 | 0 | 30 off/31 on |
| Step 5 | 1 | 0 | 1 | 0 | High Imped. | High Imped. | All transistors off |

As is apparent from this disclosure and from Table 1, this test sequence assures that each transistor is verified to be fully operational, while relay coil 22 is maintained in its original latched configuration, without requiring switching of relay coil 22 during the test procedure.

In those instances when relay coil 22 is latched in its alternate configuration, a similar test sequence is employed to individually test each transistor of CMOS devices 23 and 24 in a manner which assures that relay coil 22 remains in its latched configuration.

As described above, relay coil 22 is latched in its second configuration by the presence of a one or positive voltage at junction 41 in the presence of a zero or ground level at junction 39. As with the previous configuration, once relay coil 22 has been latched in its second alternate configuration, control logic means 25 automatically outputs a one or positive voltage to both lines 36 and 37 and a zero to both lines 48 and 49, in order to cause both CMOS devices 23 and 24 to be turned off for conserving power. Although this causes both junctions 41 and 39 to see high impedance, relay coil 22 is not activated since there is no voltage drop across relay coil 22.

With relay coil latched in its second configuration, control logic means 25 is activated by the receipt of a signal on line 46. When so activated, control logic means 25 automatically remembers the latched configuration of relay coil 22 and will initiate the proper test sequence by first outputting zeroes to lines 36 and 48, while continuing to output a one to line 37 and a zero to line 49.

The transmission of zeroes on lines 36 and 48 to CMOS device 23 causes transistor 30 to turn on and transmit a one on line 38 to relay coil 22 through junction 39, while transistors 31, 32 and 33 are turned off. Since a high impedance is still present at junction 41, the presence of a one at junction 39 assures that relay coil 22 remains in its present latched configuration.

In addition, at this time, control logic means 25 compares the signal on line 42 from junction 39 to the signal on line 36. If the signals are opposite to each other, CMOS device 23 passes this part of the test and confirms the fact that transistor 30 can turn on and that transistor 31 can turn off.

Similarly, control logic means 25 tests the signals at junction 41 through line 43 and compares this signal to the signal on line 36. If these signals are opposite or inverse to each other, CMOS device 24 passes this part of the test.

As described above, if the signal at junction 39 is found to be equivalent to the signal on line 36 or the signal at junction 41 is found to be equivalent to the signal on line 36, CMOS devices 23 and 24 fail this part of the test and the failure is noted by an output signal on line 47.

In the second step of this test sequence, control logic means 25 outputs ones to lines 36 and 48 while continuing to output a one to line 37 and a zero to line 49. The presence of ones on lines 36 and 48 causes CMOS device 23 to output a zero on line 38 to relay coil 22 through junction 39, by transistor 30 turning off and transistor 31 turning on. However, since relay coil 22 has a high impedance present at its opposed end, through junction 41, there is no voltage difference across the relay coil and no relay switching takes place.

In order to verify the proper operation of the relay drivers, control logic means 25 monitors and compares the signal on line 42 to the signal on line 36, while comparing the signal on line 43 to the signal on line 36. If the signals being compared are opposite, control logic means 25 knows that CMOS devices 23 and 24 have passed this phase of the test. In doing so, control logic means 25 verifies that transistor 30 can turn off and transistor 31 can turn on.

In the third step of this test procedure, control logic means 25 outputs a one to line 36 and a zero to line 48 causing CMOS device 23 to provide a high impedance to junction 39 through line 38. Control logic means 25 outputs zeroes to lines 37 and 49 causing transistor 32 to turn on and transistor 33 to turn off, thereby causing CMOS device 24 to output a one to junction 41 through line 40. However, since a high impedance is still present at junction 39, the presence of a one at junction 41 does not cause the relay to activate since the voltage across the relay coil is zero.

At this time, control logic means 25 compares the signal on line 43 to the signal on line 37. If the signals are opposite to each other, CMOS device 24 passes this part of the test and the ability that transistor 32 can turn on and transistor 33 can turn off is confirmed.

Similarly, control logic means 25 tests the signal at junction 39 through line 42 and compares the signal to the signal on line 37. If these signals are opposite or inverse to each other, CMOS device 23 passes this part of the test.

If the signal at junction 39 is found to be equivalent to the signal at line 37 or the signal at junction 41 is equivalent to the signal on line 37, CMOS devices 23 and 24 fail this part of the test and the failure is noted by an output signal on line 47.

In the fourth step of this test procedure, control logic means 25 outputs ones at lines 37 and 49 causing transistor 32 to turn off and transistor 33 to turn on, thereby causing CMOS device 24 to output a zero to junction 41 through line 43. At the same time, control logic means 25 outputs a one to line 36 and a zero to line 48 to cause CMOS device 23 to provide a high impedance to junction 39 through line 38. Since a high impedance is present at junction 39, the presence of a zero at junction 41 does not cause the relay to activate, since the voltage across the relay coil is zero.

At this time, control logic means 25 compares the signal on line 43 to the signal on line 37. If the signals are opposite to each other, CMOS device 24 passes this part of the test, and the ability that transistor 32 can turn off and transistor 33 can turn on is confirmed.

Similarly, control logic means 25 tests the signal at junction 39 through line 42 and compares the signal to the signal on line 37. If these signals are opposite or inverse to each other, CMOS device 23 passes this part of the test.

If the signal at junction 41 is found to be equivalent to the signal at line 37 or the signal at junction 39 is equivalent to the signal on line 37, CMOS devices 23 and 24 fail this part of the test and the failure is noted by an output signal on line 47.

The final step in the testing sequence is for control logic means 25 to output ones to both lines 36 and 37 and zeroes to both lines 38 and 49, thus returning the entire circuit to its original state with the relay drivers turned off. At this point control logic means 25 has verified the correct operation of all transistors.

By referring to Table 2, the test sequence employed for the second configuration is fully detailed, with the status of the lines and the results achieved being provided.

TABLE 2

| | Line 36 | Line 48 | Line 37 | Line 49 | Junct. 39 | Junct. 41 | Test Result |
| --- | --- | --- | --- | --- | --- | --- | --- |
| Config. 2 (set) | 1 | 1 | 0 | 0 | 0 | 1 | |

TABLE 2-continued

| | Line 36 | Line 48 | Line 37 | Line 49 | Junct. 39 | Junct. 41 | Test Result |
| --- | --- | --- | --- | --- | --- | --- | --- |
| Config. 2 (off) | 1 | 0 | 1 | 0 | High Imped. | High Imped. | |
| Test Sequence | | | | | | | |
| Step 1 | 0 | 0 | 1 | 0 | 1 | 1 | 30 on/31 off |
| Step 2 | 1 | 1 | 1 | 0 | 0 | 0 | 30 Off/31 on |
| Step 3 | 1 | 0 | 0 | 0 | 1 | 1 | 32 on/33 off |
| Step 4 | 1 | 0 | 1 | 1 | 0 | 0 | 32 off/33 on |
| Step 5 | 1 | 0 | 1 | 0 | High Imped. | High Imped. | All transistors off |

As is apparent from this disclosure, as well as Table 2, this test sequence assures that each transistor is verified to be fully operational, while relay coil 22 is maintained in its original latched configuration, without requiring switching of relay coil 22 during the test procedure.

Using this disclosure, it would be apparent to one of ordinary skill in the art that the control logic means of this invention may be implemented in a variety of ways without departing from the scope of this invention. However, in the preferred embodiment, it has been found that control logic means comprises the EP900 Erasable Programmable Logic Device manufactured by Altera Corporation of Santa Clara, CA.

By employing the EP900 Logic Device, the test sequences detailed above are implemented both efficiently and expeditiously. However, numerous alternate logic control devices can be used in accordance with this invention, to test relay drivers without switching the relay. In addition, the present invention is equally applicable to all types of latching relays, and all relay drivers.

It will thus be seen that the objects set forth above, among those made apparent from the preceding description are efficiently attained and, since certain changes may be made in the above circuit construction without departing from the scope of the invention, it is intended that all matter contained in the above description and shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A circuit for testing devices driving the coil of a relay without causing the relay to be switched, the circuit comprising:
   a relay coil;
   a first relay driver connected to one end of the relay coil;
   a second relay driver connected to the opposed end of the relay coil; and
   control means independently controllably connected to both the first relay driver and the second relay driver for transmitting separate signals thereto, independently connected to both sides of the relay coil for receiving independent signals therefrom as to the status thereof, and including logic means for sequentially initiating and transmitting a series of independent signals to the first relay driver and the second relay driver for causing each of said drivers to be actuated, while maintaining a constant voltage differential or a zero voltage differential across the relay coil, whereby each of the relay drivers is independently actuated to assure its operability while assuring that the relay coil is not activated.

2. The circuit defined in claim 1, wherein said control means further comprises comparator means for comparing the signals received from the relay coil to the signals transmitted to the relay drivers, thereby assuring the desired operation of the relay drivers.

3. The circuit defined in claim 2, wherein said control means further comprises an output for transmitting a relay driver inactive signal whenever the comparator means fails to attain the desired results.

4. The circuit defined in claim 1, wherein said control means is further defined as being responsive to the receipt of a test initiation signal to activate the logic means for initiating the transmission of the series of signals to the first and second drivers.

5. The circuit defined in claim 1, wherein said relay is further defined as comprising a latching-type relay and the first relay driver and the second relay driver are further defined as each comprising high-power CMOS devices having first and second transistors.

6. The circuit defined in claim 5, wherein the control means independently tests the operation of each transistor of the high-power CMOS device forming each relay driver.

7. The circuit defined in claim 6, wherein the series of independent signals initiated by the logic means is further defined as causing the CMOS device to produce either a voltage output, a ground output or a high impedance for transmission to the relay coil.

8. The circuit defined in claim 6, wherein the logic means further comprises a relay setting sequence for latching the relay in one of its two alternate configurations, remembering the latched configuration thereof and then automatically turning the power off to establish a zero voltage drop condition across the relay coil.

9. The circuit defined in claim 8, wherein said logic means automatically initiates a pre-set series of signals for testing each of the relay drivers based upon the particular latched configuration of the relay coil.

10. A method for testing the relay drivers of a relay coil without causing the relay to be switched, said method comprising the step of simultaneously delivering a series of independent signals to each of the relay drivers, causing the components thereof to be activated in a manner which will maintain either a constant voltage potential or a zero voltage potential across the relay coil, thereby assuring that each component of the relay driver is fully operational, without causing the relay to be activated.

11. The method defined in claim 10, wherein the relay is further defined as comprising a latching-type relay and the relay drivers are further defined as each comprising high-power CMOS devices, said method further comprising the steps of:
   delivering a relay latching signal to the relay drivers in order to latch the relay coil in one of its two alternate configurations;
   remembering the latched configuration of the relay coil; and
   initiating a power off signal to provide a zero voltage potential across the relay coil.

12. The method defined in claim 11, comprising the additional step of comparing the signals received from the relay coil to the signals delivered to the relay drivers for assuring that each of the components of the relay drivers has provided the desired output signal.

* * * * *